(12) United States Patent
Kimura et al.

(10) Patent No.: US 10,022,947 B2
(45) Date of Patent: Jul. 17, 2018

(54) LAMINATED STRUCTURE MANUFACTURING METHOD, LAMINATED STRUCTURE, AND ELECTRONIC APPARATUS

(71) Applicant: Sony Corporation, Tokyo (JP)

(72) Inventors: Nozomi Kimura, Kanagawa (JP); Keisuke Shimizu, Kanagawa (JP); Toshio Fukuda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 920 days.

(21) Appl. No.: 14/387,760

(22) PCT Filed: Mar. 27, 2013

(86) PCT No.: PCT/JP2013/002101
§ 371 (c)(1),
(2) Date: Sep. 24, 2014

(87) PCT Pub. No.: WO2013/150746
PCT Pub. Date: Oct. 10, 2013

(65) Prior Publication Data
US 2015/0064470 A1    Mar. 5, 2015

(30) Foreign Application Priority Data

Apr. 3, 2012    (JP) ................ 2012-084583

(51) Int. Cl.
*B44C 1/00* (2006.01)
*B32B 38/10* (2006.01)
(Continued)

(52) U.S. Cl.
CPC .............. *B32B 37/24* (2013.01); *B32B 9/007* (2013.01); *B32B 37/02* (2013.01); *B32B 37/12* (2013.01); *B32B 38/10* (2013.01); *H01L 21/187* (2013.01); *H01L 29/1606* (2013.01); *B32B 37/025* (2013.01); *B32B 2037/243* (2013.01);
(Continued)

(58) Field of Classification Search
CPC ......... B32B 2037/243; B32B 2250/02; B32B 2457/20; B32B 2457/208; B32B 37/02; B32B 37/025; B32B 37/12; B32B 37/24; B32B 38/10; B32B 9/007; H01L 21/187; H01L 29/1606; Y10T 428/30
See application file for complete search history.

(56) References Cited

U.S. PATENT DOCUMENTS 9,384,875 B2 *   7/2016   Kimura .............. C01B 31/0446
2011/0100951 A1   5/2011   Juang et al.
(Continued)

FOREIGN PATENT DOCUMENTS

JP    2009-298683    12/2009

OTHER PUBLICATIONS

Written Opinion of WO2013150746.*
(Continued)

*Primary Examiner* — Sonya Mazumdar
(74) *Attorney, Agent, or Firm* — Chip Law Group

(57) ABSTRACT

There is provided a laminated structure manufacturing method including bonding a graphene film of one layer or a plurality of layers formed on a first substrate to a second substrate with an adhesive resin layer, removing the first substrate, and forming a transparent layer on the graphene film.

14 Claims, 9 Drawing Sheets

(51) Int. Cl.
  *B32B 38/18* (2006.01)
  *B32B 37/10* (2006.01)
  *B32B 37/24* (2006.01)
  *B32B 37/02* (2006.01)
  *H01L 21/18* (2006.01)
  *H01L 29/16* (2006.01)
  *B32B 9/00* (2006.01)
  *B32B 37/12* (2006.01)
  *B32B 37/00* (2006.01)

(52) U.S. Cl.
  CPC ....... *B32B 2250/02* (2013.01); *B32B 2457/20* (2013.01); *B32B 2457/208* (2013.01); *Y10T 428/30* (2015.01)

(56) References Cited

U.S. PATENT DOCUMENTS

| | | |
|---|---|---|
| 2011/0308717 A1 | 12/2011 | Cho et al. |
| 2012/0025413 A1 | 2/2012 | Cho et al. |
| 2013/0161587 A1* | 6/2013 | Xianyu ............. H01L 29/66742 257/29 |

OTHER PUBLICATIONS

Bae et al., "Roll-to-roll production of 30-inch graphene films for transparenet electrodes", Nature Nanotechnology, Aug. 2010, vol. 5, pp. 574-578.

* cited by examiner

LAMINATED STRUCTURE MANUFACTURING METHOD, LAMINATED STRUCTURE, AND ELECTRONIC APPARATUS

CROSS REFERENCES TO RELATED APPLICATIONS

The present application is a national stage of International Application No. PCT/JP2013/002101 filed on Mar. 27, 2013 and claims priority to Japanese Patent Application No. 2012-084583 filed on Apr. 3, 2012, the disclosure of which is incorporated herein by reference.

BACKGROUND

The present disclosure relates to a laminated structure manufacturing method, a laminated structure, and an electronic apparatus, and is very suitable to be applied to a transparent conductive film used in, for example, a display or a touch panel, and to a variety of electronic apparatuses using the transparent conductive film.

A graphene formed by one-carbon atom-thick layer of graphite is expected to be used as a transparent conductive material or a wiring material thanks to its high conductivity. Particularly, a graphene film formed using a thermal CVD method attracts attention since the graphene film can be formed in a large area and allows the number of layers to be controlled.

In a method of forming a graphene film according to the thermal CVD method, a graphene film is formed on a metal catalyst substrate, typically, a copper foil, and thus it is necessary to transfer the graphene film from the metal catalyst substrate to a desired substrate.

As a transfer method of a graphene film in the related art, a transfer method using polymethylmethacrylate (PMMA), a transfer method using a thermal release tape, or the like has been reported (for example, refer to NPL 1)

In addition, as another transfer method of a graphene film in the related art, a method has been proposed in which a graphene sheet is formed on a carbonization catalyst film, a binder layer is formed on the graphene sheet, a substrate is adhered to the binder layer, and they are immersed into an acid solution, thereby removing the carbonization catalyst film (refer to PTL 1).

CITATION LIST

Patent Literature

[PTL 1] Japanese Unexamined Patent Application Publication No. 2009-298683

Non Patent Literature

[NPL 1] S. Bae et al., Nature Nanotechnology 5, 574 (2010)

SUMMARY

Technical Problem

However, the transfer method of a graphene film disclosed in NPL 1 has problems in that mass productivity is insufficient or transparent conductivity is reduced due to the transfer and thus is not practical.

In addition, the transfer method of a graphene film disclosed in PTL 1 has the following problems. That is to say, a copper foil is frequently used as a substrate for forming a graphene film; however, in a case of using the copper foil, heating is necessary at a high temperature when forming the graphene film, and thus it is difficult to prevent concaves and convexes from being formed in a surface of the copper foil due to the influence of recrystallization or the like. For this reason, since the transfer binder layer transfers a surface shape of the copper foil onto the surface of the graphene film along with the graphene film, the shape remains even after the copper foil is removed, and thus the surface of the transferred graphene film is considerably rough. Therefore, in a case where the graphene film is used in a transparent conductive film, a haze value which is important as characteristics of the transparent conductive film increases.

It is desirable to provide a laminated structure manufacturing method, and a laminated structure, capable of manufacturing a laminated structure including a graphene film by transferring the graphene film onto a desired substrate, and of considerably reducing a haze value in a case of being used as a transparent conductive film.

It is further desirable to provide a high performance electronic apparatus using a laminated structure, as a transparent conductive film or the like, which includes a graphene film and can considerably reduce a haze value in a case of being used as the transparent conductive film.

It is still further desirable to provide a laminated structure manufacturing method, and a laminated structure, capable of manufacturing a laminated structure including a graphene film by transferring the graphene film onto a desired substrate with favorable adhesiveness while effectively preventing defects from occurring, and of considerably reducing a haze value in a case of being used as a transparent conductive film so as to obtain good mass productivity.

It is still further desirable to provide a high performance electronic apparatus using a laminated structure with good mass productivity, as a transparent conductive film or the like, which includes a graphene film, effectively prevents defects from occurring in the graphene film, and can considerably reduce a haze value in a case of being used as the transparent conductive film.

Solution to Problem

A laminated structure manufacturing method according to an embodiment of the present disclosure includes bonding a graphene film of one layer or a plurality of layers formed on a first substrate to a second substrate with an adhesive resin layer; removing the first substrate; and forming a transparent layer on the graphene film.

In the present disclosure, a content of a volatile component of the resin layer is preferably less than 1% by weight, more preferably equal to or less than 0.5% by weight, and most preferably equal to or less than 0.1% by weight, from the viewpoint of preventing defects from occurring in the transferred graphene film and improving film quality. In a typical example, the laminated structure manufacturing method further includes pressing the first substrate and the second substrate so as to be bonded to each other without a gap after bonding the graphene film formed on the first substrate to the second substrate with the resin layer and before removing the first substrate. In addition, typically, the laminated structure manufacturing method further includes curing the resin layer after pressing the first substrate and the second substrate so as to be bonded to each other without a gap and before removing the first substrate. A method of curing the resin layer is appropriately selected according to the kind of resin layer. For example, if the resin layer is made of an ultraviolet curable resin, the resin layer can be cured by applying ultraviolet rays, and, if the resin layer is made of a thermosetting resin, the resin layer can be cured through heating. In a typical example, an adhesive resin layer of which a content of a volatile component is less than 1% by weight is applied on the graphene film formed on the first substrate. In another example, an adhesive resin layer which includes a volatile component of at least 1% by weight or more is applied on the graphene film formed on the first substrate, and the volatile component is removed by drying the resin layer, so as to form the adhesive resin layer of which a content of the volatile component is less than 1% by weight. The adhesive resin layer of which a content of the volatile component is less than 1% by weight is preferably flowable at room temperature; however, the resin layer may be flowable in a heating state, and, in this case, the graphene film formed on the first substrate is bonded to the second substrate in the heating state.

The resin layer is typically made of an ultraviolet curable resin, a thermosetting resin, or a thermoplastic resin, and is selected among them as necessary, but is not limited thereto. In a case where the laminated structure is used as a transparent conductive film, the hardness of the resin layer is preferably appropriately selected, from the viewpoint of transparent conductivity, particularly, improvement in conductivity. Specifically, the resin layer is sufficiently hard, and, in other words, the elastic modulus of the resin layer is sufficiently large and is preferably, for example, about 400 MPa or more. This is because, if the resin layer is soft, in other words, the elastic modulus is small, defects tend to occur in the graphene film bonded to the resin layer, the sheet resistance increases, variations in sheet resistance occur, and the like. Particularly, in a case where a graphene film is transferred using a resin layer which is used without a curing process, that is, an adhesive, the elastic modulus of this resin layer is very small, and thus the transparent conductivity is considerably reduced. The elastic modulus of the resin layer is selected to be sufficiently large, and thereby it is possible to obtain favorable transparent conductivity. The first substrate and the second substrate are selected as necessary. Particularly, a desired substrate is used as the second substrate according to a usage of the graphene film.

The transparent layer formed on the graphene film may be fundamentally formed using any material as long as the material is transparent with respect to visible light. The transparent layer may use the same material as the resin layer, or a layer made of various transparent resins may be used as the transparent layer. The transparent resin may include, for example, polyethylene terephthalate, polyethylene naphthalate, polycarbonate, polystyrene, polyethylene, polypropylene, polyphenylene sulfide, polyvinylidene fluoride, acetyl cellulose, phenoxy bromide, aramids, polyimides, polystyrenes, polyarylates, polysulfones, polyolefins, and the like. The surface of the transparent layer is preferably sufficiently flat. The thickness of the transparent layer is appropriately selected according to a usage or the like of the laminated structure, but, the thickness thereof is preferably selected such that concaves and convexes formed in the surface of the graphene film can be sufficiently buried and further a sufficiently flat surface is obtained.

Refractive indexes of the resin layer and the transparent layer are appropriately selected such that an increase in a haze value due to occurrence of unnecessary reflection interfaces in the entire laminated structure is prevented and thus the transmittance of the laminated structure can be improved. Here, a description will be made of a reflectance of light at an interface where substances having different refractive indexes come into contact with each other. This reflectance is expressed by the following Fresnel equation.

$$R(\%)=((n-n')/(n+n'))^2 \times 100$$

Here, R indicates a reflectance, and n and n' indicate refractive indexes of the respective substances. The refractive indexes of the resin layer and the transparent layer may be preferably determined after taking reflectance of all interfaces in the laminated structure, calculated using the Fresnel equation, into consideration. For example, a refractive index of the transparent layer is approximately the same as a refractive index of the resin layer, and, for example, a difference between the refractive index of the transparent layer and the refractive index of the resin layer is preferably equal to or less than 0.3, more preferably equal to or less than 0.2, and most preferably equal to or less than 0.1. Here, as an example, it is assumed that an interface between the second substrate and the resin layer is considered, the second substrate is made of polyethylene terephthalate (PET), and a refractive index thereof is about 1.57. At this time, a value of the reflectance relative to a value of the refractive index of the resin layer is calculated as in Table 1.

TABLE 1

| Refractive Index of PET | Refractive Index of Resin Layer | Refractive Index Difference | Reflectance R (%) |
| --- | --- | --- | --- |
| 1.57 | 1.52 | 0.05 | 2.618322 |
| 1.57 | 1.62 | 0.05 | 2.4567369 |
| 1.57 | 1.47 | 0.1 | 10.8206371 |
| 1.57 | 1.67 | 0.1 | 9.5259869 |
| 1.57 | 1.37 | 0.2 | 46.2770142 |
| 1.57 | 1.77 | 0.2 | 35.8564309 |

It can be seen from Table 1 that, if a refractive index difference of PET and the resin layer is about 0.1 or less, a reflectance is about 0.1% or less, and if a refractive index difference is 0.05 or less, a reflectance is about 0.025% or less, and thus there is little reflection.

In addition, in a case where an uppermost layer is a transparent layer, and the transparent layer comes into contact with the air, an interface between the transparent layer and the air may be a reflection interface, and, in a case where a transparent body is further provided on the transparent layer, and the transparent body comes into contact with the air, an interface between the transparent body and the air may be a reflection interface. In this case, a layer or a body of which a refractive index is closer to the refractive index of the air (for example, nafion of which a refractive index is 1.38) is used as the transparent layer or the transparent body, or, for example, an anti-reflection layer formed of multiple films is provided on the air side, so as to prevent a haze value from increasing, thereby improving the transmittance.

When the refractive index of the air is 1, a value of the reflectance relative to a value of the refractive index of the transparent layer or the transparent body is calculated as in Table 2.

TABLE 2

| Refractive Index of Air | Refractive Index of Transparent Layer or Transparent Body | Refractive Index Difference | Reflectance R (%) |
|---|---|---|---|
| 1 | 1.05 | 0.05 | 0.0594884 |
| 1 | 1.1 | 0.1 | 0.22675737 |
| 1 | 1.2 | 0.2 | 0.826446281 |
| 1 | 1.3 | 0.3 | 1.701323251 |
| 1 | 1.4 | 0.4 | 2.777777778 |
| 1 | 1.5 | 0.5 | 4 |

It can be seen from Table 2 that, if a refractive index difference of the transparent layer or the transparent body and the air is about 0.1 or less, a reflectance is about 0.23% or less, and if a refractive index difference is 0.05 or less, a reflectance is about 0.06% or less, and thus there is little reflection.

The laminated structure manufacturing method further includes forming another layer on the transparent layer as necessary, for example, forming at least one layer selected from a group including an anti-reflection layer, an anti-glare layer, a hard coat layer, and an anti-pollution layer. At least one layer selected from a group including an anti-reflection layer, an anti-glare layer, a hard coat layer, and an anti-pollution layer, may be formed on a rear surface of the second substrate (a main surface of the second substrate on an opposite side to the graphene film), as necessary. In addition, the resin layer may have a function of the anti-reflection layer depending on cases. Further, the laminated structure manufacturing method further includes bonding the laminated structure to a transparent substrate (for example, a glass substrate, a film, or the like) or a display as necessary.

A usage of the laminated structure in which the graphene film and the second substrate are bonded with the resin layer and the transparent layer is formed on the graphene film is not particularly limited, and the laminated structure may be preferably used as a transparent conductive film, for example, a transparent conductive sheet. In this case, a transparent substrate which is transparent with respect to visible light is used as the second substrate. This transparent conductive film may be used for a variety of electronic apparatuses. The electronic apparatus is specifically, for example, a display such as a liquid crystal display (LCD), an organic electroluminescence display (an organic EL display) or a touch panel, and a usage of the transparent conductive film is also not limited. The transparent conductive film may be used as, for example, a transparent electrode of a solar cell, for example, a dye sensitized solar cell or the like.

A laminated structure according to another embodiment of the present disclosure includes a second substrate; an adhesive resin layer on the second substrate; a graphene film of one layer or a plurality of layers bonded to the resin layer; and a transparent layer on the graphene film.

In addition, an electronic apparatus according to still another embodiment of the present disclosure includes the laminated structure having a second substrate; an adhesive resin layer on the second substrate; a graphene film of one layer or a plurality of layers bonded to the resin layer; and a transparent layer on the graphene film.

The description related to the laminated structure manufacturing method is also applied to the laminated structure and the electronic apparatus unless contrary to the nature thereof.

In the above-described present disclosure, the graphene film and the second substrate are bonded via the adhesive resin layer, and thus the graphene film can be transferred to the second substrate with favorable adhesiveness. In addition, since the graphene film formed on the first substrate is bonded to the second substrate with the resin layer and the first substrate is then removed, and thereby the graphene film can be easily transferred onto the second substrate, mass productivity is good. Further, since the transparent layer is formed on the graphene film, concaves and convexes of the substrate formed when the graphene film is formed can be buried by the transparent layer. In addition, a content of a volatile component of the resin layer which is used for bonding is, for example, less than 1% by weight, there are few bubbles occurring due to volatilization of the volatile component when being cured, and there are few defects occurring in the graphene film due to the bubbles.

Advantageous Effects of Invention

According to the embodiments of the present disclosure, it is possible to obtain a laminated structure in which a graphene film can be transferred to a desired substrate, and a haze value can be considerably reduced when used as a transparent conductive film. In addition, it is possible to effectively prevent defects from occurring in a graphene film. Further, the laminated structure has good mass productivity. Furthermore, it is possible to implement a variety of electronic apparatuses such as a high definition display or touch panel by using the excellent laminated structure as a transparent conductive film or the like.

Additional features and advantages are described herein, and will be apparent from the following Detailed Description and the figures.

DETAILED DESCRIPTION

Hereinafter, embodiments of the present disclosure will be described. In addition, the description will be made in the following order.
1. First Embodiment (Laminated Structure and Manufacturing Method thereof 1)
2. Second Embodiment (Laminated Structure and Manufacturing Method thereof 2)
3. Third Embodiment (Laminated Structure and Manufacturing Method thereof 3)
4. Fourth Embodiment (Laminated Structure and Manufacturing Method thereof 4)
5. Fifth Embodiment (Transparent Conductive Film and Manufacturing Method thereof)
6. Sixth Embodiment (Display and Manufacturing Method thereof)

1. First Embodiment
[Laminated Structure and Manufacturing Method Thereof 1]

FIGS. 1A to 1C and FIGS. 2A to 2C illustrate a laminated structure and a manufacturing method thereof according to the first embodiment.

Figure 1A:
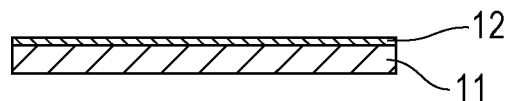
FIG. 1A is a cross-sectional view illustrating a laminated structure and a manufacturing method thereof according to a first embodiment.

As illustrated in FIG. 1A, a graphene film 12 of one or a plurality of layers is formed on a first substrate 11. As the first substrate 11, a substrate in which a metal catalyst such as copper or nickel is formed on at least a surface thereof is used, and, for example, a substrate in which a nickel catalyst layer is formed on a copper substrate such as a copper foil or a silicon substrate is used, but is not limited thereto. A method of forming the graphene film 12 is not particularly limited, but a thermal CVD method is preferably used.

Figure 1B:
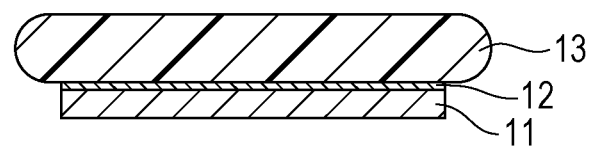
FIG. 1B is a cross-sectional view illustrating a laminated structure and a manufacturing method thereof according to the first embodiment.

Next, as illustrated in FIG. 1B, an adhesive resin layer 13 which contains below 1% by weight, preferably, 0.5% or less by weight, and, more preferably, 0.1% or less by weight of a volatile component, is applied on the graphene film 12. In order to planarize the surface of the resin layer 13, the thickness of the resin layer 13 is selected to be, preferably, 30 micrometers or less, and, more preferably, 20 micrometers or less, for example. In addition, in order to obtain a sufficient adhesive strength, the thickness of the resin layer 13 is selected to be, preferably, 1 micrometer or more, and, more preferably, 2 micrometers or more, for example. An adhesion of the resin layer 13 is preferably, for example, 2 N/m or more at room temperature, but is not limited thereto.

As application methods of the resin layer 13, methods in the related art may be used and are selected as necessary. The application methods may include, specifically, for example, spin coating, immersion, and casting, various printing methods such as screen printing, inkjet printing, offset printing, and gravure printing, and various coating methods such as stamping, spraying, an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method.

As the resin layer 13, for example, an ultraviolet (UV) curable resin, a thermosetting resin, a thermoplastic resin, or the like may be used, and is selected as necessary. A material of the resin layer 13 may include, specifically, for example, a siloxane compound, an acryl compound, an epoxy compound, or the like, and is selected among them as necessary.

Figure 1C:
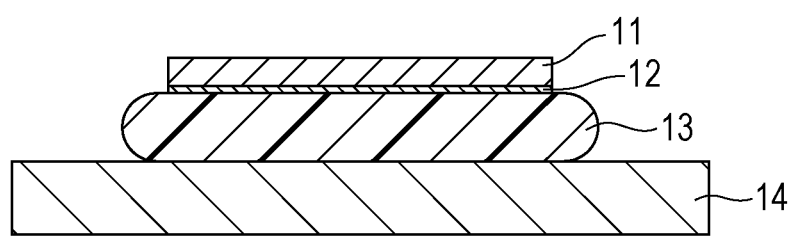
FIG. 1C is a cross-sectional view illustrating a laminated structure and a manufacturing method thereof according to the first embodiment.

Next, as illustrated in FIG. 1C, the first substrate 11, the graphene film 12, and the resin layer 13 are placed on a second substrate 14 such that the resin layer 13 faces downward, and thereby the graphene film 12 formed on the first substrate 11 and the second substrate 14 are bonded with the resin layer 13. A desired substrate is used as the second substrate 14. The second substrate 14 may be a transparent substrate or an opaque substrate. A material of the transparent substrate is selected as necessary, and may include, for example, a transparent inorganic material such as quartz or glass, or transparent plastic. A transparent plastic substrate is used as a transparent flexible substrate. The transparent plastic may include, for example, polyethylene terephthalate, polyethylene naphthalate, polycarbonate, polystyrene, polyethylene, polypropylene, polyphenylene sulfide, polyvinylidene fluoride, acetyl cellulose, phenoxy bromide, aramids, polyimides, polystyrenes, polyarylates, polysulfones, polyolefins, and the like. For example, a silicone substrate is used as the opaque substrate. Before the first substrate 11, the graphene film 12, and the resin layer 13 are placed on the second substrate 14, a hydrophilic process or a silane coupling process may be performed on the surface of the second substrate 14 according to the type of the resin layer 13.

Figure 2A:
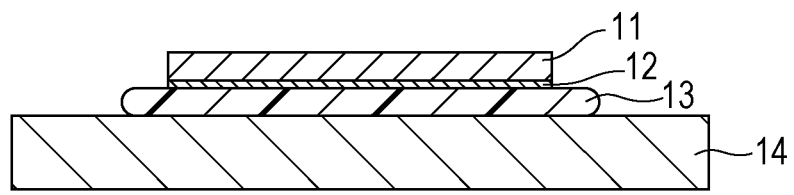
FIG. 2A is a cross-sectional view illustrating a laminated structure and a manufacturing method thereof according to the first embodiment.

Next, as illustrated in FIG. 2A, the first substrate 11 is pressed against the second substrate 14 so as to reduce the thickness of the resin layer 13 to a desired thickness, thereby bonding the first substrate 11 to the second substrate 14 without a gap. A pressing method is not particularly limited, and the pressing may be performed, for example, using a roller or by tightly pressing a plate. At this time, the pressing is preferably performed such that bubbles included in the resin layer 13 are removed along with the reduced thickness. In a case where the resin layer 13 has liquidity at room temperature, the pressing can be performed at room temperature; however, in a case where flowability is not obtained without a heating state, the pressing is performed in the heating state. The thickness of the pressed resin layer 13 is preferably selected to be the minimum in a range in which the graphene film 12 and the second substrate 14 are bonded with the resin layer 13 with favorable adhesiveness. The minimum thickness of the resin layer 13 is, for example, 1 micrometer or more to 3 micrometers or less.

Figure 2B:
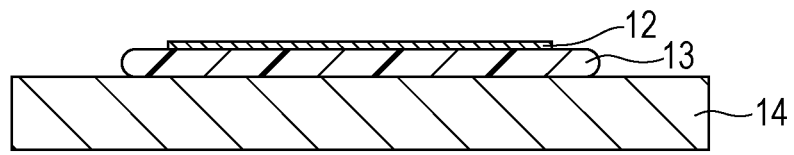
FIG. 2B is a cross-sectional view illustrating a laminated structure and a manufacturing method thereof according to the first embodiment.

Next, as illustrated in FIG. 2B, the first substrate 11 is removed. Etching is preferably used to remove the first substrate 11. An etching method is not particularly limited as long as the metal catalyst forming the first substrate 11 is removed. As the etching method, either dry etching using a vacuum device or wet etching using an etchant (etching solution) may be used, but the wet etching is preferably used from the viewpoint of etching efficiency. The wet etching may be performed by spraying an etchant onto the first substrate 11 with a spray, or by immersing the first substrate 11 into an etchant put in an etching vessel. The etchant used for the wet etching is not particularly limited as long as the metal catalyst can be dissolved. In a case where the metal catalyst is made of copper, for example, if the first substrate 11 is made of copper, a mixture of hydrochloric acid with iron chloride or copper chloride may be preferably used as the etchant; however, acid such as phosphoric acid or nitric acid, or an oxidation-reduction etchant such as iron nitrate or iron chloride may be used. In a case of using the oxidation-reduction etchant, since bubbles are not generated when etching is performed, defects can be suppressed from occurring in the graphene film 12 and the metal catalyst can be uniformly dissolved. In a case of performing the wet etching by immersing the first substrate 11 into an etchant put in an etching vessel, the etchant is preferably stirred when the etching is performed in order to increase an etching rate. The etching may use electrolytic etching in a copper sulfate liquid solution.

Next, the surface of the graphene film 12 which is exposed by removing the first substrate 11 is cleaned with pure water or the like and is dried.

Figure 2C:
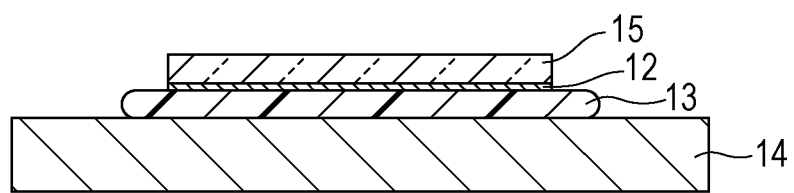
FIG. 2C is a cross-sectional view illustrating a laminated structure and a manufacturing method thereof according to the first embodiment.

Next, as illustrated in FIG. 2C, a transparent layer 15 is formed on the graphene film 12. A forming method of the transparent layer 15 is not particularly limited as long as concaves and convexes of the surface of the graphene film 12 can be buried. If the same material as the resin layer 13 is used as the transparent layer 15, the same method as the method of forming the resin layer 13 may be used. For example, if a refractive index of the transparent layer 15 is set to n1, and a refractive index of the resin layer 13 is set to n2, materials of the transparent layer 15 and the resin layer 13 are selected such that, preferably, the absolute value of $(n_1-n_2)$ is smaller than or equal to 0.2, and, more preferably, the absolute value of $(n_1-n_2)$ is smaller than or equal to 0.05.

The transparent layer 15 may be made of the same material as the resin layer 13, or made of a hard coat material. In addition, in consideration of wires being drawn out of the graphene film 12 when the laminated structure is produced as a device, parts of the graphene film 12 joined to the wires are not desirably covered by the transparent layer 15.

In this above-described way, the graphene film 12 can be transferred to the second substrate 14 from the first substrate 11, and the graphene film 12 and the second substrate 14 are bonded with the resin layer 13, thereby obtaining a laminated structure in which the transparent layer 15 is formed on the graphene film 12. Optionally, a protective layer may be formed on the transparent layer 15. A layer which has approximately the same refractive index as the transparent layer 15 is preferably used as the protective layer. Specifically, for example, a glass plate, a polyethylene terephthalate (PET) film or the like may be used as the protective layer.

Figure 3A:
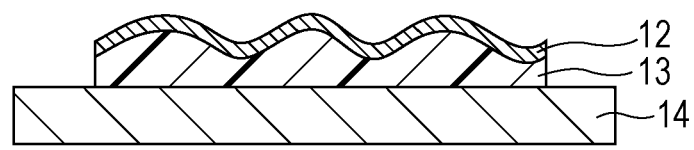
FIG. 3A is a cross-sectional view illustrating a state in which the concaves and convexes formed in the surface of the graphene film are buried by a transparent layer in the laminated structure and the manufacturing method thereof according to the first embodiment.
Figure 3B:
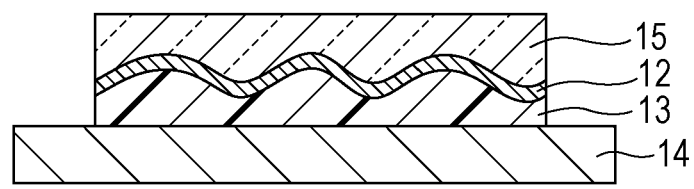
FIG. 3B is a cross-sectional view illustrating a state in which the concaves and convexes formed in the surface of the graphene film are buried by a transparent layer in the laminated structure and the manufacturing method thereof according to the first embodiment.

FIGS. 3A and 3B respectively correspond to FIGS. 2B and 2C and illustrate a state in which the concaves and convexes of the surface of the graphene film 12 are buried by the resin layer 13.

As above, according to the first embodiment, the graphene film 12 and the second substrate 14 are bonded with the resin layer 13, and thus the adhesiveness of the graphene film 12 for the second substrate 14 is favorable. In addition, since a volatile component contained in the resin layer 13 when the graphene film 12 and the second substrate 14 are bonded is less than 1% by weight which is a very small amount, there are few volatile components which volatilize from the resin layer 13, and few bubbles occur in processes after the graphene film 12 and the second substrate 14 are bonded. For this reason, there is little concern that defects may occur in the graphene film 12 due to bubbles. In addition, since a volatile component contained in the resin layer 13 is less than 1% by weight which is a very small amount, bubbles can be suppressed from occurring due to the volatile component even if the resin layer 13 is applied in a large area, and thus the graphene film 12 can be formed in a large area. Further, when the first substrate 11 is removed through etching, the graphene film 12 is tightly held by the second substrate 14 via the resin layer 13, and thus defects can be efficiently suppressed from occurring in the graphene film 12. Particularly, in a case of etching and removing the first substrate 11 by spraying an etchant on the first substrate 11 with a spray, defects can be more efficiently suppressed from occurring in the graphene film 12. In addition, in a case of performing wet etching by immersing the first substrate 11 into an etchant put in an etching vessel, even if all of the first substrate 11, the graphene film 12, the resin layer 13, and the second substrate 14 are violently moved when the etching is performed, peeling or defects can be suppressed from occurring. For this reason, the wet etching can be performed while stirring the etchant, and thus an etching rate can be increased, thereby reducing etching time. Furthermore, a resin layer remains on a graphene film formed on a substrate in a transfer method in the related art, but, according to the first embodiment, since the resin layer 13 is present between the graphene film 12 and the second substrate 14 and is not present on the graphene film 12, a process for removing the resin layer is unnecessary unlike in the transfer method in the related art, and it is possible to improve transfer throughput.

In addition, if a transparent substrate is used as the second substrate 14, it is possible to obtain a transparent conductive film formed by a laminated structure in which the graphene film 12 and the second substrate 14 are bonded with the resin layer 13 and the transparent layer 15 is formed on the graphene film 12. In this case, since the transparent layer 15 is formed on the graphene film 12, the concaves and convexes of the surface formed when the graphene film 12 is formed can be buried by the transparent layer 15. For this reason, it is possible to obtain a transparent conductive film in which a haze value is very small. For example, in a case where a haze value when the transparent layer 15 is not formed is about 10%, a haze value when the transparent layer 15 is formed can be considerably reduced to about 3%. In addition, the graphene film 12 is protected by the transparent layer 15, and thus the lifespan of the transparent conductive film can be improved. This good transparent conductive film is very suitable to be used for, for example, a display, a touch panel, a dye sensitized solar cell, and the like.

2. Second Embodiment

[Laminated Structure and Manufacturing Method Thereof 2]

FIGS. 4A to 4C and FIGS. 5A to 5C illustrate a laminated structure and a manufacturing method thereof according to the second embodiment.

Figure 4A:
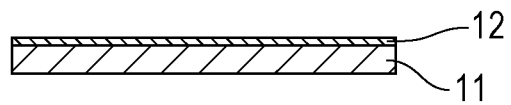
FIG. 4A is a cross-sectional view illustrating a laminated structure and a manufacturing method thereof according to a second embodiment.

As illustrated in FIG. 4A, the graphene film 12 is formed on the first substrate 11 in the same manner as in the first embodiment.

Figure 4B:
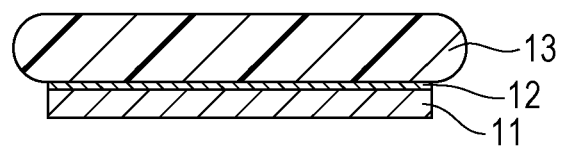
FIG. 4B is a cross-sectional view illustrating a laminated structure and a manufacturing method thereof according to the second embodiment.

Next, as illustrated in FIG. 4B, the adhesive resin layer 13 which contains at least 1% by weight or more of a volatile component is applied on the graphene film 12. A material, a thickness and an application method of the resin layer 13 are the same as in the first embodiment.

Figure 4C:
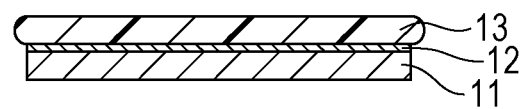
FIG. 4C is a cross-sectional view illustrating a laminated structure and a manufacturing method thereof according to the second embodiment.

Next, as illustrated in FIG. 4C, the resin layer 13 is dried so as to volatilize the volatile component such that the volatile component is less than 1% by weight, preferably, equal to or less than 0.5% by weight, and, more preferably, equal to or less than 0.1% by weight. This drying decreases the thickness of the resin layer 13. The resin layer 13 uses a resin layer which has adhesiveness after being dried and further a self-deformation property.

Figure 5A:
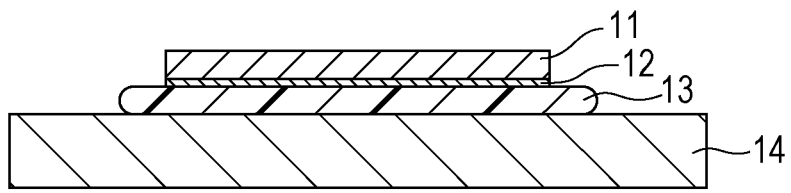
FIG. 5A is a cross-sectional view illustrating a laminated structure and a manufacturing method thereof according to the second embodiment.

Next, as illustrated in FIG. 5A, the first substrate 11, the graphene film 12, and the resin layer 13 are placed on a second substrate 14 such that the resin layer 13 faces downward, and thereby the graphene film 12 formed on the first substrate 11 and the second substrate 14 are bonded with the resin layer 13. The same substrate as in the first embodiment may be used as the second substrate 14.

Figure 5B:
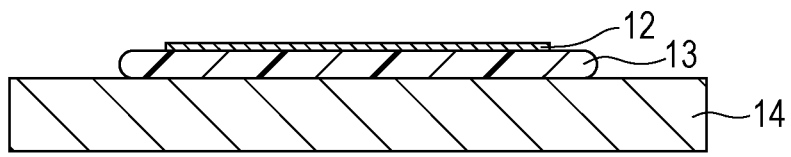
FIG. 5B is a cross-sectional view illustrating a laminated structure and a manufacturing method thereof according to the second embodiment.

Next, as illustrated in FIG. 5B, the first substrate 11 is removed in the same manner as in the first embodiment.

Next, the surface of the graphene film 12 which is exposed by removing the first substrate 11 is cleaned with pure water or the like and is dried.

Figure 5C:
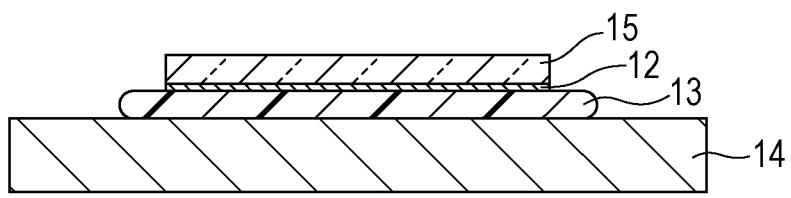
FIG. 5C is a cross-sectional view illustrating a laminated structure and a manufacturing method thereof according to the second embodiment.

Next, as illustrated in FIG. 5C, a transparent layer 15 is formed on the graphene film 12. The transparent layer 15 is selected in the same manner as in the first embodiment. In addition, in the same manner as in the first embodiment, parts of the graphene film 12 joined to wires are not desirably covered by the transparent layer 15.

In this above-described way, the graphene film 12 can be transferred to the second substrate 14 from the first substrate 11, and the graphene film 12 and the second substrate 14 are bonded with the resin layer 13, thereby obtaining a laminated structure in which the transparent layer 15 is formed on the graphene film 12.

According to the second embodiment, it is possible to obtain the same various advantages as in the first embodiment.

3. Third Embodiment

[Laminated Structure and Manufacturing Method Thereof 3]

Figure 6:
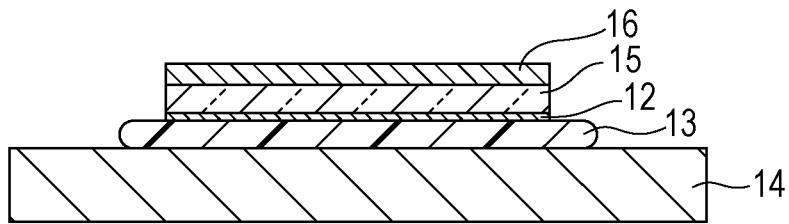
FIG. 6 is a cross-sectional view illustrating a laminated structure and a manufacturing method thereof according to a third embodiment.
Figure 7:
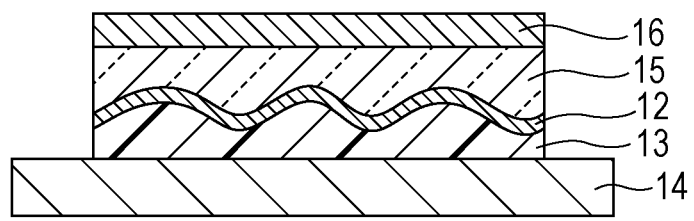
FIG. 7 is a cross-sectional view illustrating a state in which the concaves and convexes formed in the surface of the graphene film are buried by a transparent layer in the laminated structure and the manufacturing method thereof according to the third embodiment.

As illustrated in FIG. 6, in the third embodiment, at least one functional layer 16 selected from a group including an anti-reflection layer, an anti-glare layer, a hard coat layer, and an anti-pollution layer, is formed on the transparent layer 15. FIG. 7 illustrates a state in which the concaves and convexes of the surface of the graphene film 12 are buried by the transparent layer 15.

An anti-reflection layer is used as the functional layer 16, and thereby it is possible to prevent light incident to the laminated structure from being reflected. An anti-glare layer is used as the functional layer 16, and thereby it is possible to prevent glare due to light incident to the laminated structure. A hard coat layer is used as the functional layer 16, and thereby it is possible to protect the surface of the laminated structure. An anti-pollution layer is used as the functional layer 16, and thereby it is possible to prevent, for example, fingerprints from being left on the surface of the laminated structure. Layers in the related art may be used as the anti-reflection layer, the anti-glare layer, the hard coat layer, and the anti-pollution layer, and are selected as necessary. The thickness of the anti-reflection layer, the anti-glare layer, the hard coat layer, and the anti-pollution layer is selected as necessary.

The third embodiment other than the above description is the same as the first embodiment or the second embodiment.

According to the third embodiment, it is possible to obtain a laminated structure including the graphene film 12, which has a very small haze value, has high transmittance, and is very suitable to be used as a transparent conductive film of a touch panel.

4. Fourth Embodiment

[Laminated Structure and Manufacturing Method Thereof 4]

In the fourth embodiment, after a structure where the graphene film 12 is formed on the second substrate 14 via the resin layer 13 and before the transparent layer 15 is formed thereon, at least one process is performed among processes such as patterning of the graphene film 12, doping of various dopants to the graphene film 12, formation of a wire (a drawn-out electrode), and formation of other structures, according to a usage or a function of the laminated structure.

Specifically, for example, the graphene film 12 is patterned in a photolithography method using laser etching, or dry etching such as oxygen plasma or UV ozone treatment. In addition, the graphene film 12 is doped by adsorbing a gas such as oxygen or applying a dopant such as a sulfuric acid, nitric acid or gold chloride solution to or on the graphene film 12. Further, a wire is formed on the graphene film 12 using a printing method or a photolithography method.

The fourth embodiment other than the above description is the same as the first embodiment or the second embodiment. In the fourth embodiment, in a case where wires joined to the graphene film 12 are formed until the transparent layer 15 is formed, some of the wires are further joined to an external circuit therefrom, and thus are not desirably covered by the transparent layer 15.

According to the fourth embodiment, the same advantages as in the first embodiment can be obtained.

5. Fifth Embodiment

[Transparent Conductive Film and Manufacturing Method Thereof]

Figure 8:
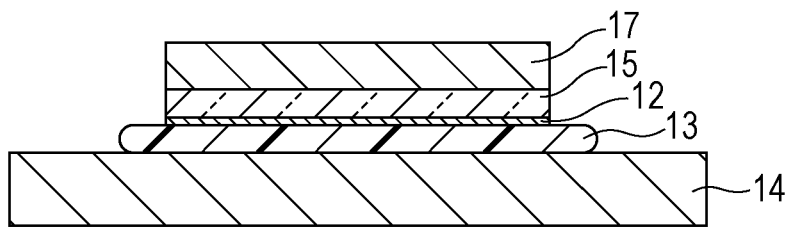
FIG. 8 is a cross-sectional view illustrating a transparent conductive film and a manufacturing method thereof according to a fifth embodiment.
Figure 9:
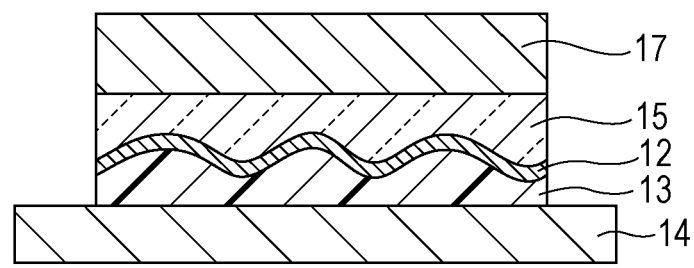
FIG. 9 is a cross-sectional view illustrating a state in which the concaves and convexes formed in the surface of the graphene film are buried by a transparent layer in the transparent conductive film and the manufacturing method thereof according to the fifth embodiment.

As shown in FIG. 8, in the fifth embodiment, the transparent layer 15 side of the laminated structure is bonded to a transparent film 17. FIG. 9 illustrates a state in which the concaves and convexes of the surface of the graphene film 12 are buried by the transparent layer 15. A material and a thickness of the film 17 are not particularly limited, and are selected as necessary.

According to the fifth embodiment, it is possible to obtain a transparent conductive film using a laminated structure which has a very small haze value, has high transmittance, and includes the graphene film 12.

6. Sixth Embodiment

[Display and Manufacturing Method Thereof]

Figure 10:
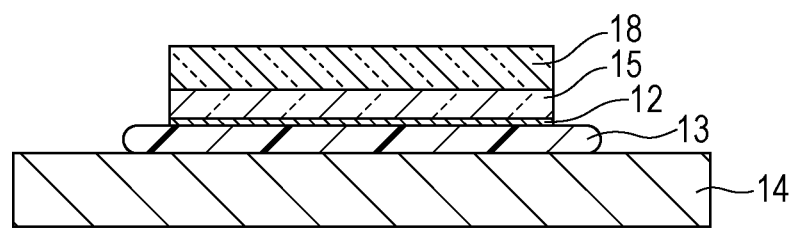
FIG. 10 is a cross-sectional view illustrating a display and a manufacturing method thereof according to a sixth embodiment.
Figure 11:
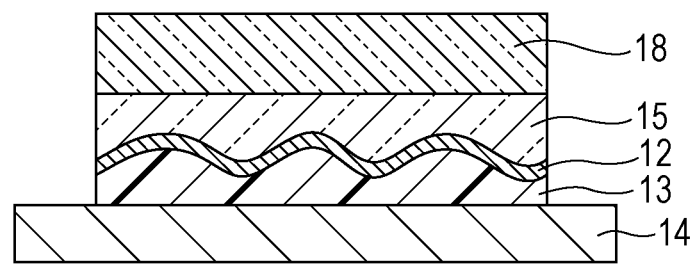
FIG. 11 is a cross-sectional view illustrating a state in which the concaves and convexes formed in the surface of the graphene film are buried by a transparent layer in the display and the manufacturing method thereof according to the sixth embodiment.

As illustrated in FIG. 10, in the sixth embodiment, the transparent layer 15 side of the laminated structure is bonded to a screen of a display 18. FIG. 11 illustrates a state in which the concaves and convexes of the surface of the graphene film 12 are buried by the transparent layer 15. The display 18 is a liquid crystal display, an organic EL display, or the like, but is not limited thereto.

According to the sixth embodiment, it is possible to obtain a display in which a transparent conductive film using a laminated structure which has a very small haze value, has high transmittance, and includes the graphene film 12, is bonded to a screen.

EXAMPLE 1

Example Corresponding to First Embodiment

A copper foil was used as the first substrate 11.

The copper foil was placed in a quartz tube furnace of a CVD device, heated at 1000 degrees Celsius, and a hydrogen ($H_2$) gas and a methane ($CH_4$) gas were made to flow (the hydrogen gas flow rate 8 sccm, the methane gas flow rate 24 sccm, and the pressure 0.3 Torr), thereby forming a graphene film on the copper foil. After the formation, the temperature decreased while making the hydrogen gas flow again. Thereafter, the copper foil on which the graphene film was formed was extracted from the quartz tube furnace.

Next, a UV curable acryl resin (made by Daikin Industries, Ltd., UV-3000) in which a content of a solvent which is a volatile component is at least 0.1% by weight or less was spin-coated in liquid at room temperature under conditions of 4000 rpm and 40 seconds, thereby forming a resin layer on the graphene film formed on the copper foil. The thickness of the resin layer was about 20 micrometers.

Next, a PET film was used as the second substrate 14, and the resin layer side of the resin layer formed by the UV curable resin applied on the graphene film formed on the copper foil faces downward and is placed on the PET film so as to be bonded thereto.

Next, a plate was tightly pressed from the copper foil so as to reduce the thickness of the resin layer 13 and to finally have the thickness of about 2 micrometers.

Next, ultraviolet rays were applied from the rear side of the PET film and penetrated through the PET film such that the resin layer was irradiated with the ultraviolet rays and was then cured. The irradiation conditions were irradiation power density 160 $W/cm^2$, and irradiation time was 40 seconds.

Next, all of the PET film, the resin layer, the graphene film, and the copper foil were immersed into an iron nitrate ($Fe(NO_3)_3$) liquid solution of 1 M for 50 minutes, thereby etching and removing the copper foil.

Successively, all of the PET film, the resin layer, and the graphene film were cleaned with hyperpure water and were dried.

Next, a transparent layer was formed on the graphene film using the same resin as the resin layer, and a PET film was bonded thereonto.

In the above-described way, the graphene film and the PET film were bonded with the resin layer, and a laminated structure in which the transparent layer and the PET film were formed on the graphene film was formed.

EXAMPLE 2

Example Corresponding to First Embodiment

In Example 2, a laminated structure was formed in the same manner as in Example 1 except that a UV curable acryl resin different from Example 1, in which a content of a solvent which is a volatile component is at least 0.1% by weight or less in liquid at room temperature, is used as the resin layer 13.

EXAMPLE 3

Example Corresponding to First Embodiment

In Example 3, a laminated structure was formed in the same manner as in Example 1 except that a UV curable acryl resin different from Examples 1 and 2, in which a content of a solvent which is a volatile component is at least 0.1% by weight or less in liquid at room temperature, is used as the resin layer 13.

EXAMPLE 4

Example Corresponding to First Embodiment

In Example 4, a laminated structure was formed in the same manner as in Example 1 except that a UV curable acryl resin different from Examples 1 to 3, in which a content of a solvent which is a volatile component is at least 0.1% by weight or less in liquid at room temperature, is used as the resin layer 13.

EXAMPLE 5

Example Corresponding to First Embodiment

In Example 5, a laminated structure was formed in the same manner as in Example 1 except that a UV curable acryl resin different from Examples 1 to 4, in which a content of a solvent which is a volatile component is at least 0.1% by weight or less in liquid at room temperature, is used as the resin layer 13.

EXAMPLE 6

Example Corresponding to First Embodiment

In Example 6, a laminated structure was formed in the same manner as in Example 1 except that a UV curable epoxy resin in which a content of a solvent which is a volatile component is at least 0.1% by weight or less in liquid at room temperature is used as the resin layer 13.

EXAMPLE 7

Example Corresponding to Second Embodiment

In the same manner as in Example 1, a graphene film was formed on a copper foil, and the copper foil was extracted from the quartz tube furnace.

A thermosetting resin (made by Soken Chemical Engineering Co., Ltd., SK-Dyne 2300 ("SK-Dyne" is a registered trademark)) and a curing agent (made by Soken Chemical Engineering Co., Ltd., L-45) were mixed at a weight ratio of 100:5, propylene glycol monomethylether acetate (PEG-MEA) is added and dissolved such that a concentration of SK-Dyne 2300 which is a main agent becomes 50% by weight, thereby preparing a SK-Dyne 2300 solution. The SK-Dyne 2300 solution was drop-casted on the graphene film formed on the copper foil and was then dried at room temperature so as to form a resin layer and to reduce a content of a volatile component in the resin layer to less than 1% by weight. The thickness of the resin layer was about 20 micrometers.

Next, a glass substrate was used as the second substrate 14, and the resin layer side of the resin layer formed by the thermosetting resin applied on the graphene film formed on the copper foil faces downward and is placed on the glass substrate so as to be bonded thereto.

Next, the resin layer is heated at 150 degrees Celsius for three minutes so as to be cured and to be completely adhered between the graphene film and the glass substrate.

After being cooled, all of the glass substrate, the resin layer, the graphene film, and the copper foil were immersed into an iron nitrate liquid solution of 1 M for 50 minutes, thereby etching and removing the copper foil.

Successively, all of the glass substrate, the resin layer, and the graphene film were cleaned with hyperpure water and were dried.

Next, a transparent layer was formed on the graphene film using the same resin as the resin layer, and a PET film was bonded thereonto.

In the above-described way, the graphene film and the glass substrate were bonded with the resin layer, and a laminated structure in which the transparent layer and the PET film were formed on the graphene film was formed.

EXAMPLE 8

Example Corresponding to First Embodiment

In Example 8, a laminated structure was formed in the same manner as in Example 1 except that a transparent layer is formed by bonding an OCA (Optical Clear Adhesive) tape (made by Nitto Denko Corporation, CS9621T) on the graphene film and a PET film is bonded thereonto.

COMPARATIVE EXAMPLE 1

In the same manner as in Example 1, a graphene film was formed on a copper foil, and the copper foil was extracted from the quartz tube furnace.

Polyvinylphenol (PVP) which is a thermosetting resin and a melamine which is a crosslinking agnet were mixed at a weight ratio of 10:1, propylene glycol monomethylether acetate (PEGMEA) is added and dissolved such that a concentration of PVP becomes 10% by weight, thereby preparing a PVP solution. The PVP solution was spin-coated on the graphene film formed on the copper foil under conditions of 3000 rpm and 30 seconds so as to form a resin layer made of the PVP thermosetting resin. The resin layer contained a volatile component of at least several % by weight. The thickness of the resin layer was about 20 micrometers.

The resin layer side of the resin layer made of the PVP thermosetting resin applied on the graphene film formed on the copper foil faces downward and is placed on the glass substrate so as to be bonded thereto.

Next, the resin layer made of the PVP thermosetting resin was baked at 180 degrees Celsius for 20 minutes so as to be cured.

Next, all of the glass substrate, the resin layer, the graphene film, and the copper foil were immersed into an iron nitrate liquid solution of 1 M for 50 minutes, thereby etching and removing the copper foil.

Successively, all of the glass substrate, the resin layer, and the graphene film were cleaned with hyperpure water and were dried.

In the above-described way, a laminated structure in which the graphene film and the glass substrate were bonded with the resin layer was formed.

COMPARATIVE EXAMPLE 2

In the same manner as in Example 1, a graphene film was formed on a copper foil, and the copper foil was extracted from the quartz tube furnace.

A thermoplastic resin is dissolved in ethyl acetate so as to reach a content of 30% by weight. The thermoplastic resin solution was spin-coated on the graphene film formed on the copper foil under conditions of 4000 rpm and 30 seconds so as to form a resin layer made of the thermoplastic resin (Kuraray Co., Ltd., LA#2140e). The resin layer contained a volatile component of at least several % by weight. The thickness of the resin layer was about 20 micrometers.

The resin layer side of the resin layer made of the thermoplastic resin applied on the graphene film formed on the copper foil faces downward and is placed on the glass substrate so as to be bonded thereto.

Next, the resin layer was baked at 150 degrees Celsius for five minutes so as to be cured.

Next, all of the glass substrate, the resin layer, the graphene film, and the copper foil were immersed into an iron nitrate liquid solution of 1 M for 50 minutes, thereby etching and removing the copper foil.

Successively, all of the glass substrate, the resin layer, and the graphene film were cleaned with hyperpure water and were dried.

In the above-described way, a laminated structure in which the graphene film and the glass substrate were bonded with the resin layer was formed.

COMPARATIVE EXAMPLE 3

In Comparative Example 3, a laminated structure was formed in the same manner as Comparative Example 1 except that a UV curable acryl resin which contained a volatile component of at least several % by weight or more was used as the resin layer 13 instead of the PVP thermosetting resin.

[Evaluation of Characteristics of Graphene Film]

An in-surface distribution of sheet resistance was measured with respect to the graphene films of Examples 1 to 7 and the Comparative Examples 1 to 3. Results thereof are illustrated in FIG. 12.

Figure 12:
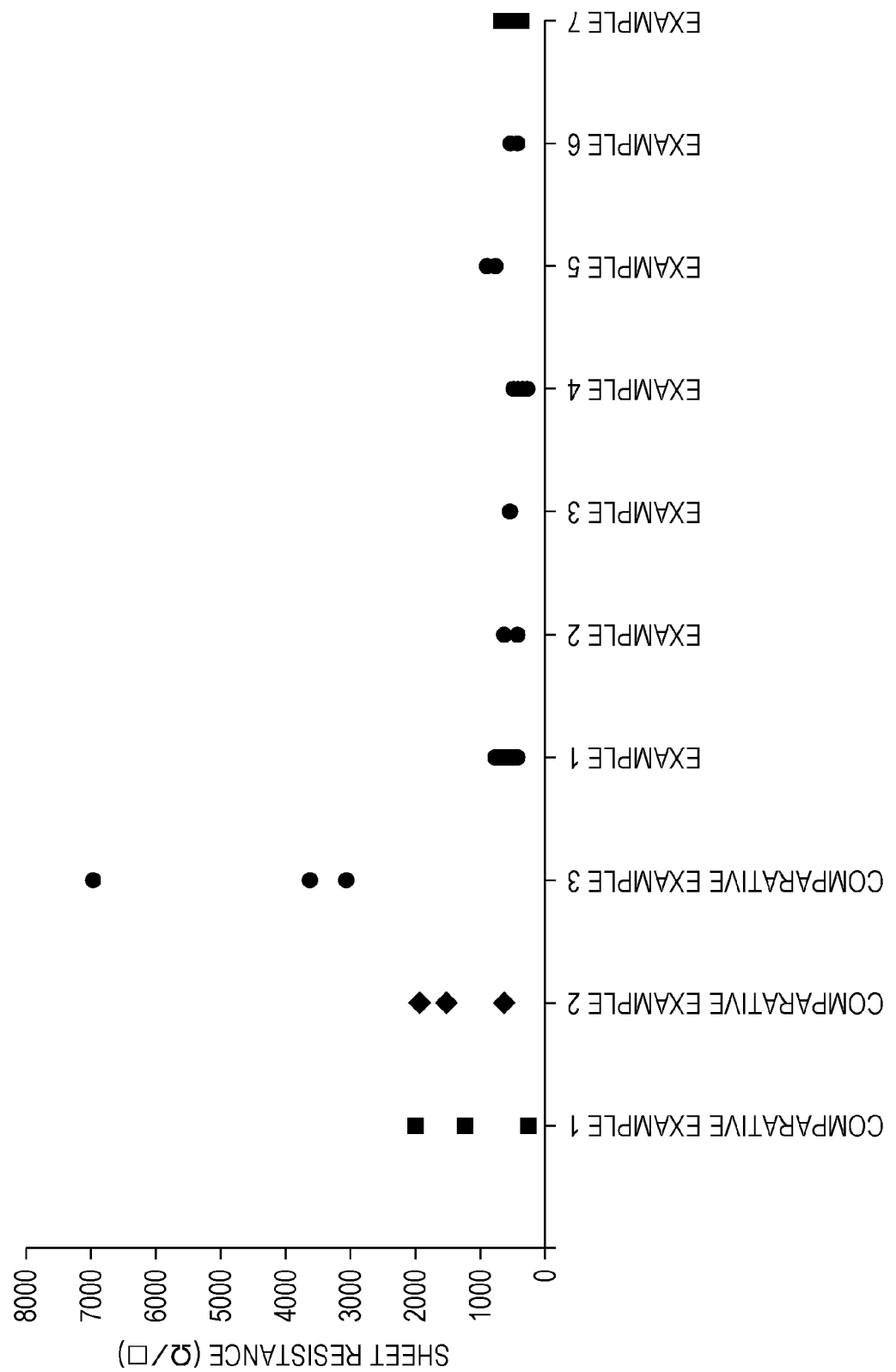
FIG. 12 is a schematic line diagram illustrating test results of Examples 1 to 7 and Comparative Examples 1 to 3.

As illustrated in FIG. 12, it can be seen that the graphene films of Comparative Examples 1 to 3 have large sheet resistance and considerable in-surface variations, whereas the graphene films of Examples 1 to 7 have small sheet resistance, small in-surface variations, and are thus favorable graphene films. In addition, as a result of performing optical microscope observation, fine voids caused by bubbles were observed in the graphene films of Comparative Examples 1 to 3, whereas such voids were not observed in the graphene films of Examples 1 to 7.

In addition, a haze value of the laminated structure of Example 2 was 0.81% which was small, whereas a haze value when the transparent layer and the PET film were not formed on the resin layer in this laminated structure was 14.5% which was large. In addition, a haze value of the laminated structure of Example 3 was 0.72% which was small, whereas a haze value when the transparent layer and the PET film were not formed on the resin layer in this laminated structure was 6.31% which was large. Further, a haze value of the laminated structure of Example 6 was 2.17% which was small, whereas a haze value when the transparent layer and the PET film were not formed on the resin layer in this laminated structure was 8.33% which was large. Furthermore, a haze value of the laminated structure of Example 8 was 1.81% which was small, whereas a haze value when the transparent layer and the PET film were not formed on the resin layer in this laminated structure was 14.5% which was large. It can be seen that, in any Example, the transparent layer is formed on the resin layer such that concaves and convexes of the surface of the graphene film are buried, and, as a result, a haze value is considerably reduced.

Figure 13:
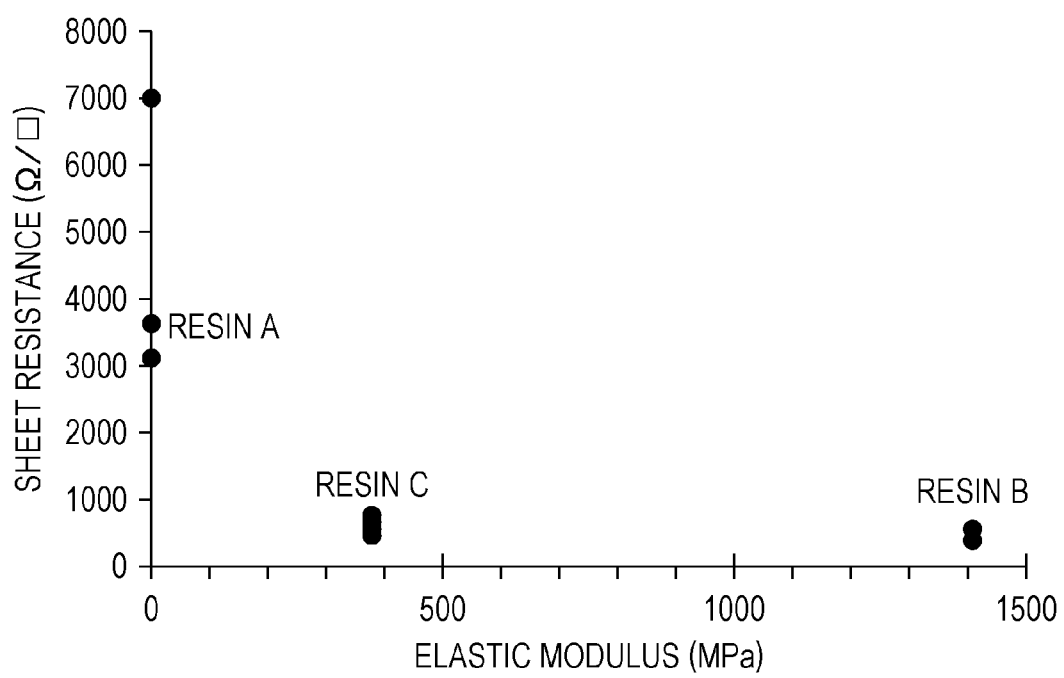
FIG. 13 is a schematic line diagram illustrating a relationship between the elastic modulus of a resin layer and the sheet resistance of a graphene film.

FIG. 13 illustrates a relationship between an elastic modulus which is an index of hardness of the resin layer 13 and sheet resistance of the graphene film. Three kinds of resin layers (indicated by resins A, B and C) were used as the resin layer 13. The resin A is a UV curable acryl resin, the resin B is a UV curable acryl resin used in Example 1, and the resin C is a UV curable acryl resin used in Example 2. The elastic modulus of the resin A is approximately 0, the elastic modulus of the resin B is approximately 400 MPa, and the elastic modulus of the resin C is approximately 1400 Mpa. As can be seen from FIG. 13, in the resins B and C, the sheet resistance of the graphene film is sufficiently low, and the variation is very small; however, in the resin A, the sheet resistance of the graphene film is high, and the variation is also very large. It can be seen from FIG. 13 that the sheet resistance of the graphene film can be made to be sufficiently low, and the variation can be made to be sufficiently low in a case where the elastic modulus of the resin layer 13 is at least about 400 MPa or more.

As above, although the embodiments and Examples have been described in detail, the present technology is not limited to the above-described embodiments and Examples and may be variously modified.

For example, the dimensions, structures, processes, shapes, and materials described in the above embodiments and Examples are only an example, and dimensions, structures, processes, shapes, materials, and the like different therefrom may be used as necessary.

In addition, the present technology may have the following configurations.

(1) A laminated structure manufacturing method including bonding a graphene film of one layer or a plurality of layers formed on a first substrate to a second substrate with an adhesive resin layer; removing the first substrate; and forming a transparent layer on the graphene film.

(2) The laminated structure manufacturing method set forth in (1), further including pressing the first substrate and the second substrate so as to be bonded to each other without a gap after bonding the graphene film formed on the first substrate to the second substrate with the resin layer and before removing the first substrate.

(3) The laminated structure manufacturing method set forth in (1) or (2), further including curing the resin layer after pressing the first substrate and the second substrate so as to be bonded to each other without a gap and before removing the first substrate.

(4) The laminated structure manufacturing method set forth in any one of (1) to (3), wherein the resin layer is made of an ultraviolet curable resin, a thermosetting resin, or a thermoplastic resin.

(5) The laminated structure manufacturing method set forth in any one of (1) to (4), wherein the resin layer is applied on the graphene film formed on the first substrate.

(6) The laminated structure manufacturing method set forth in any one of (1) to (5), wherein the second substrate is a transparent substrate.

(7) The laminated structure manufacturing method set forth in any one of (1) to (6), wherein the transparent layer is made of a transparent resin.

(8) The laminated structure manufacturing method set forth in any one of (1) to (7), further including forming at least one layer selected from a group including an anti-reflection layer, an anti-glare layer, a hard coat layer, and an anti-pollution layer, on the transparent layer.

(9) The laminated structure manufacturing method set forth in any one of (1) to (8), wherein the laminated structure is a transparent conductive film.

(10) The laminated structure manufacturing method set forth in any one of (1) to (9), further including bonding the laminated structure to a transparent substrate or a display.

(11) The laminated structure manufacturing method set forth in any one of (1) to (10), wherein a content of a volatile component of the resin layer is less than 1% by weight.

(12) The laminated structure manufacturing method set forth in any one of (1) to (10), wherein a content of a volatile component of the resin layer is equal to or less than 0.1% by weight.

(13) The laminated structure manufacturing method set forth in any one of (1) to (10), wherein a resin layer which includes a volatile component of at least 1% by weight or more is applied on the graphene film formed on the first substrate, and the volatile component is removed by drying the resin layer, so as to form the adhesive resin layer of which a content of the volatile component is less than 1% by weight.

(14) The laminated structure manufacturing method set forth in any one of (1) to (13), wherein the thickness of the resin layer is 1 micrometer or more to 30 micrometers or less.

In addition, the following method may be considered as a method for reducing a haze value of a laminated structure including a graphene film. In other words, a copper foil is typically used as the first substrate 11 on which a graphene film is formed; however, the flatness of the main surface of the copper foil which is used in the related art is not necessarily favorable, which is a great factor generating concaves and convexes in a surface of a graphene film formed on the copper foil. Therefore, a copper foil with flatness which is more favorable than in the related art is used as the copper foil. In this way, concaves and convexes of a surface of a graphene film bonded to the resin layer 13 can be reduced, and thus it is possible to reduce a haze value.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

11 First substrate
12 Graphene film
13 Resin layer
14 Second substrate
15 Transparent layer 16 Functional layer
17 Film
18 Display

The invention claimed is:

1. A method for manufacturing a laminated structure, the method comprising:
   bonding at least one layer of a graphene film to a second substrate with an adhesive resin layer,
   wherein the graphene film is on a first substrate;
   removing the first substrate; and
   forming a transparent layer on the graphene film.

2. The method for manufacturing the laminated structure according to claim 1, further comprising pressing the first substrate and the second substrate to bond the at least one layer of the graphene film to the second substrate without a gap.

3. The method for manufacturing the laminated structure according to claim 2, further comprising curing the pressed adhesive resin layer to bond the at least one layer of the graphene film to the second substrate without the gap.

4. The method for manufacturing the laminated structure according to claim 3, wherein the adhesive resin layer comprises at least one of an ultraviolet curable resin, a thermosetting resin, or a thermoplastic resin.

5. The method for manufacturing the laminated structure according to claim 1, further comprising applying the adhesive resin layer on the grapheme film to bond the graphene film to the second substrate.

6. The method for manufacturing the laminated structure according to claim 1, wherein the second substrate is a transparent substrate.

7. The method for manufacturing the laminated structure according to claim 1, wherein the transparent layer comprises a transparent resin.

8. The method for manufacturing the laminated structure according to claim 1, further comprising forming at least one functional layer selected from a group including an anti-reflection layer, an anti-glare layer, a hard coat layer, and an anti-pollution layer, on the transparent layer.

9. The method for manufacturing the laminated structure according to claim 1, wherein the laminated structure is a transparent conductive film.

10. The method for manufacturing the laminated structure according to claim 1, further comprising bonding the laminated structure to one of a transparent substrate or a display surface.

11. The method for manufacturing the laminated structure according to claim 1, wherein a content of a volatile component in the adhesive resin layer is less than 1% by weight.

12. The method for manufacturing the laminated structure according to claim 1, wherein a content of a volatile component in the adhesive resin layer is equal to or less than 0.1% by weight.

13. The method for manufacturing the laminated structure according to claim 1, further comprising:
   drying the adhesive resin layer on the graphene film to remove a volatile component in the adhesive resin layer,
   wherein the adhesive resin layer includes the volatile component of at least 1% by weight or more.

14. The method for manufacturing the laminated structure according to claim 1, wherein a thickness of the adhesive resin layer is 1 micrometer or more to 30 micrometers or less.

* * * * *